United States Patent
Miljanic et al.

(10) Patent No.: US 9,759,748 B2
(45) Date of Patent: Sep. 12, 2017

(54) METHODS AND DEVICES FOR AC CURRENT SOURCES, PRECISION CURRENT TRANSDUCERS AND DETECTORS

(71) Applicant: Guildline Instruments Limited, Smith Falls (CA)

(72) Inventors: Petar Miljanic, Belgrade (RS); Tomasz Barczyk, Ottawa (CA)

(73) Assignee: Guildline Instruments Limited, Smith Falls (CA)

( * ) Notice: Subject to any disclaimer, the term of this patent is extended or adjusted under 35 U.S.C. 154(b) by 88 days.

(21) Appl. No.: 14/663,580

(22) Filed: Mar. 20, 2015

(65) Prior Publication Data

US 2015/0268280 A1    Sep. 24, 2015

Related U.S. Application Data

(60) Provisional application No. 61/968,557, filed on Mar. 21, 2014.

(51) Int. Cl.
    *G01R 15/18*    (2006.01)
(52) U.S. Cl.
    CPC .................... *G01R 15/185* (2013.01)

(58) Field of Classification Search
    CPC ...... G01R 15/185; G01R 15/183; H01F 38/28; H01F 27/38
    See application file for complete search history.

(56) References Cited

U.S. PATENT DOCUMENTS

| | | | | |
|---|---|---|---|---|
| 2002/0181261 A1* | 12/2002 | Gaudreau | ............. | H02M 1/088 363/108 |
| 2013/0088895 A1* | 4/2013 | Ye | ............. | H02M 3/337 363/17 |

* cited by examiner

*Primary Examiner* — Clayton E LaBalle
*Assistant Examiner* — Noam Reisner
(74) *Attorney, Agent, or Firm* — The Law Office of Michael E. Kondoudis

(57) ABSTRACT

Precision AC voltage, current, phase, power and energy measurements and calibrations with current ranges from 1 uA to 20 kA and voltage ranges from 1V to 1000 kV are now performed with accuracies of better than one part per million. Continued demand for improved accuracy has led the inventors to address improvements to dual stage and multi-stage current transducers that may form the basis of the measuring process within many of the measurement instruments providing the precision AC measurements and calibrations. Additionally, the improvements to dual stage and multi-stage current transducers provide for novel feedback controlled precision AC current sources without requiring measurement of the AC current source output directly.

14 Claims, 13 Drawing Sheets

METHODS AND DEVICES FOR AC CURRENT SOURCES, PRECISION CURRENT TRANSDUCERS AND DETECTORS

CROSS-REFERENCE TO RELATED APPLICATIONS

This patent application claims the benefit of priority from U.S. Provisional patent application 61/968,557 filed Mar. 21, 2014 entitled "Methods and Devices for AC Current Sources, Precision Current Transducers and Detectors," the entire contents of which are incorporated herein by reference.

FIELD OF THE INVENTION

This invention relates generally to precision AC current sources, precision current transducers, and measurements, which include precision AC current, voltage, phase, impedance, frequency, power and energy measurements, over current ranges from 1 mA or less to 20 kA or greater and voltage ranges of 1V or less to 1000 kV or greater and over frequency ranges from a few hertz to hundreds of kilohertz. In particular it relates to precision AC current sources, precision current transducers, and measurements using enhanced dual stage current transducers.

BACKGROUND OF THE INVENTION

Alternating Current (AC) electrical measurements are used in a wide variety of applications and may be performed for a variety of electrical quantities including, for example, voltage, current, capacitance, impedance, frequency, phase, power, energy, and resistance. These tests and measurements include those relating to designing, evaluating, maintaining and servicing electrical circuits and equipment range from high voltage electrical transmission lines operating at hundreds of kilovolts (kV) and kiloamps (kA) to industrial/medical/residential electrical and lighting, typically 400V/240V/100V and 30/15 A, to a wide variety of industrial/scientific/medical/consumer electrical and electronic devices operating at voltages of hundreds of mV and currents of a few mA.

Within a variety of AC current applications and AC current test equipment systems AC comparator bridges and AC current transformers are employed to provide the required dynamic range, accuracy, and flexibility. AC current bridge configurations remove many of the issues associated with achieving making measurements at accuracies of a part, or few parts per million, such as insensitivity to lead resistances, excellent ratio linearity, excellent ratio stability, and a high level of resolution. AC current transformers, importantly, isolate the measuring instruments from what may be very high voltage in the monitored circuit and when the current in a circuit is too high to be directly applied to measuring instruments, a current transformer produces a reduced current accurately proportional to the current in the circuit, which can be conveniently connected to measuring and recording instruments. They also allow accurate high current generation from precision lower current sources and isolation of the precision source from external variations.

Accordingly many sources and measurement systems for alternating current power systems have a current transformer at their output and input stages respectively. Over the past approximately 180 years whilst a wide variety of types of electrical transformer are made for different purposes these, despite their design differences, employ the same basic principle as discovered in 1831 by Michael Faraday, and share several key functional parts. Over this period many techniques have been developed to improve the accuracy of the current transformer. Among them, the dual stage current transformer, described in the work of Brooks and Holtz in "The Two-Stage Current Transformer" (AIEE Trans., Vol. 41, pp 382-393, 1922) still forms the basis for a significant proportion of commercial systems. These transformers are generally what is referred to as "step down transformers" for converting high voltage-low current inputs to lower voltage-higher current outputs.

However, in a range of other applications within electrical systems and measurement systems what is required are precision AC current sources and AC amplifiers. The inventors have found that improvement of the accuracy when designing a precision AC current source is a different problem to measurement systems in that we either wish to remove measuring equipment connected to the output circuit to provide the feedback or wish that the generation and measurement of even very large current AC current sources is performed without requiring the use of a shunt.

Accordingly, the inventors have established design and circuit methodologies which are applicable to precision AC current sources, amplifiers, and also AC current measurements. Such measurements include precision AC current, voltage, phase, impedance, frequency, power and energy measurements, over current ranges from 1 mA or less to 20 kA or greater and voltage ranges of 1V or less to 1000 kV or greater and over frequency ranges from a few hertz to hundreds of kilohertz. Similarly, precision AC current sources and amplifiers for test, measurement, and supply applications are desirable over current ranges from 1 mA or less to 20 kA or greater and voltage ranges of 1V or less to 1000 kV or greater and over frequency ranges from a few hertz to hundreds of kilohertz.

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to provide improvements over the prior art in respect of AC precision current sources, amplifiers, and measurements, which include precision AC current, voltage, phase, impedance, frequency, power and energy measurements, over current ranges from 1 mA or less to 20 kA or greater and voltage ranges of 1V or less to 1000 kV or greater and over frequency ranges from a few hertz to hundreds of kilohertz. In particular it relates to precision AC current sources, precision current transducers, and measurements using enhanced dual stage current transducers.

In accordance with an embodiment of the invention there is provided a device comprising:
a dual stage current transducer comprising at least a primary winding, a first secondary winding and a second secondary winding;
a first four terminal shunt coupled across the first secondary winding; and
a second four terminal shunt coupled across the second secondary winding; wherein
a first voltage generated across the second four terminal shunt is subtracted from a second voltage generated across the first four terminal shunt.

In accordance with an embodiment of the invention there is provided a device comprising:
a dual stage current transducer comprising at least a primary winding, a first secondary winding and a second secondary winding;
a first four terminal shunt coupled across the first secondary winding;
a second four terminal shunt coupled across the second secondary winding;
an alternating current source disposed between the first secondary winding and first four terminal shunt; and
a third four terminal shunt coupled in series with a load across the primary winding.

In accordance with an embodiment of the invention there is provided a method comprising providing a multi-stage current transducer with a first means to obtain a first voltage proportional to a primary current of said multi-stage current transducer and a second means to obtain a second voltage proportional to a secondary current in a second stage of the multi-stage current transducer, said secondary current being proportional to the magnetizing current of the magnetic core of a first stage of the multi-stage current transducer.

In accordance with an embodiment of the invention there is provided a method comprising:
providing a current transducer having two stages where current of a first secondary of the current transducer passes through a first four terminal shunt and a current of a second secondary of the current transducer passes through a second four terminal shunt;
summing the voltages from the first and second four terminal shunts to represent the instantaneous value of the primary current within the current transducer; and
at least one of:
digitizing the resulting summed voltage; and
providing the current transducer comprises providing a first magnetic core of the current transducer in the form of a hollow toroid and a second magnetic core of the current transducer in the form of a toroid core embedded within the first magnetic core.

In accordance with an embodiment of the invention there is provided a method comprising providing a bridge for establishing the value of the resistance and the inductance of a load, the bridge comprising a current transducer having two stages and first to third four terminal shunts, wherein a first current within a first secondary of the current transducer passes through a first four terminal shunt, a second current within a second secondary of the current transducer passes through a second four terminal shunt and a third current passing through the load disposed across a primary of the current transducer also passes through the third four terminal shunt.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

The present invention is directed to improvements over the prior art in respect of AC precision current sources, precision current transducers, and measurements, which include precision AC current, voltage, phase, impedance, frequency, power and energy measurements, over current ranges from 1 mA or less to 20 kA or greater and voltage ranges of 1V or less to 1000 kV or greater and over frequency ranges from a few hertz to hundreds of kilohertz. In particular it relates to precision AC current sources, precision current transducers, and measurements using enhanced dual stage current transducers.

The ensuing description provides exemplary embodiment(s) only, and is not intended to limit the scope, applicability or configuration of the disclosure. Rather, the ensuing description of the exemplary embodiment(s) will provide those skilled in the art with an enabling description for implementing an exemplary embodiment. It being understood that various changes may be made in the function and arrangement of elements without departing from the spirit and scope as set forth in the appended claims.

Within the drawings presented in respect of this specification elements having the same number are the same element and may or may not be referenced explicitly in every drawing due to the recurring elements being commonly numbered.

Dual stage transformers as known by one of skill in the art comprise three windings together with one or more magnetic cores. These three windings are commonly referred to as the primary winding, to which the signal to be transformed by the dual stage transformer is coupled, the first secondary winding, from which the transformed signal is coupled, and the second secondary winding (also known as the correction winding), from which a signal (commonly referred to as the correction signal) is coupled. The primary winding and first secondary winding may in some embodiments of the dual stage transformer be conceptually identical and coupled with the same magnetic flux and can be, for example, swapped to reverse the dual stage transformer operation. In contrast the second secondary winding cannot be swapped with either of the main windings, namely the primary winding and first secondary winding. Within this document, except for the claims and the summary of the invention where the terms first secondary winding and second secondary winding are maintained, the first secondary winding will be referred to as the "secondary winding" (with the current flowing within it referred to as the secondary current) and the second secondary winding will be referred to as the correction winding (with the current flowing within it referred to as the correction current).

Figure 1:
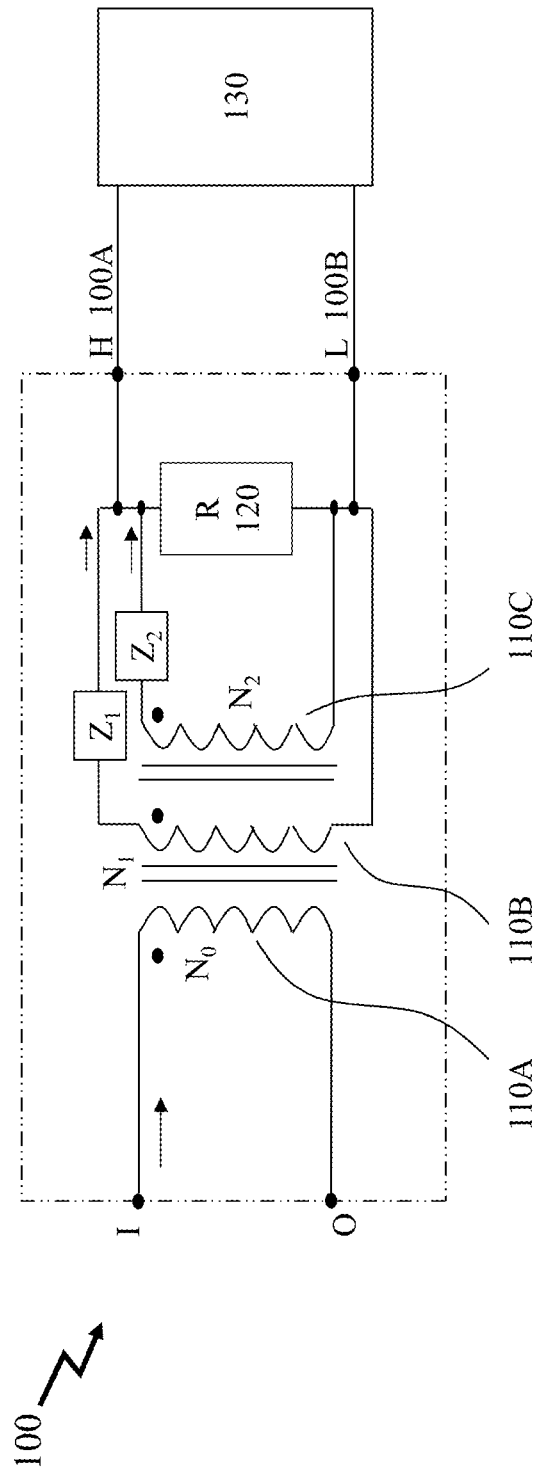
FIG. 1 depicts an AC current transformer according to the prior art using a dual stage current transformer design of Brooks and Holtz.

Referring to FIG. 1 there is depicted a dual stage transformer 100 according to the prior art of Brooks and Holtz, see "The Two-Stage Current Transformer" (AIEE Trans., Vol. 41, pp 382-393, 1922). Within this the current transformation is effected in two stages, the first generated by secondary winding $N_1$ 110B in response to the signal coupled to the primary winding $N_0$ 110A, which is approximately correct in magnitude and phase. The second stage is the generation of an auxiliary corrective current via correction winding $N_2$ 110C which, when combined with the secondary current, gives a resultant current which very closely approximates to the secondary current which would be furnished by an ideal current transformer having no errors. As depicted the secondary and correction windings 110B and 110C respectively are coupled across load resistor 120 generating a potential across first and second outputs 100A and 100B respectively which are coupled to circuit 130, which for example contains one or more analog-to-digital converters (ADCs) as part of measuring the converted signal. According to the ratio of the turns in the primary winding 110A to the secondary and correction windings 110B and 110C the resulting output may be scaled up from the input signal, scaled down, or even be simply equal such that the measurement circuit, e.g. circuit 130, is buffered from the input signal carrying circuit.

Figure 2A:
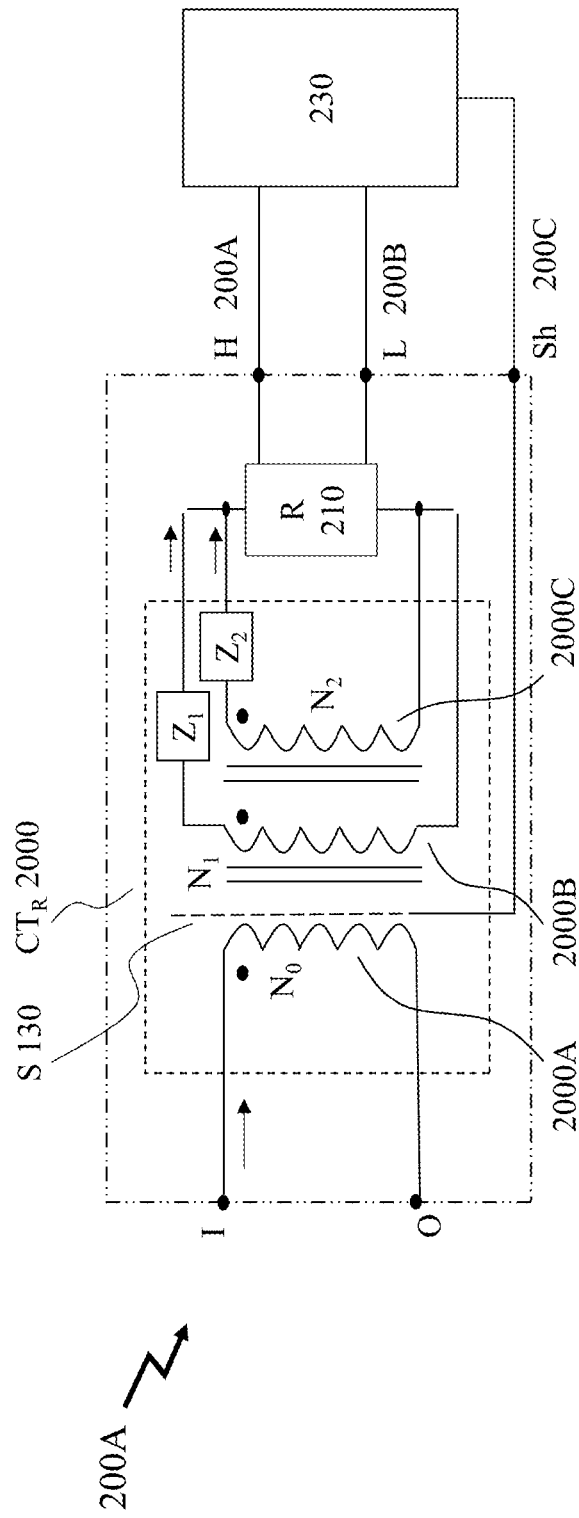
FIG. 2A depicts a circuit using a dual stage AC current transducer with electrical shield and four terminal resistor for improved accuracy.

Referring to FIG. 2A there is depicted a dual stage transducer 200A wherein a current transducer $CT_R$ 2000 again comprises primary winding 2000A and secondary and correction windings 2000B and 2000C but now a shield 130 is disposed between the primary winding 2000A and the magnetic core of the current transducer 2000 and coupled via shield port Sh 200C to circuit 230. Also within dual stage transducer 200 the load resistor 120 is replaced by a non-inductive four terminal shunt R 210 thereby increasing the accuracy of the reproduced voltage across the signal output ports 200A and 200B respectively. The non-inductive four terminal shunt R 210 may, for example, be a "Kelvin" configuration resistor with four terminals (via leads) allowing a current to be applied though a pair of opposite leads and the voltage to be sensed across the other pair of opposite leads. The "Kelvin" configuration effectively eliminates the resistance and temperature dependence of the leads.

Figure 2B:
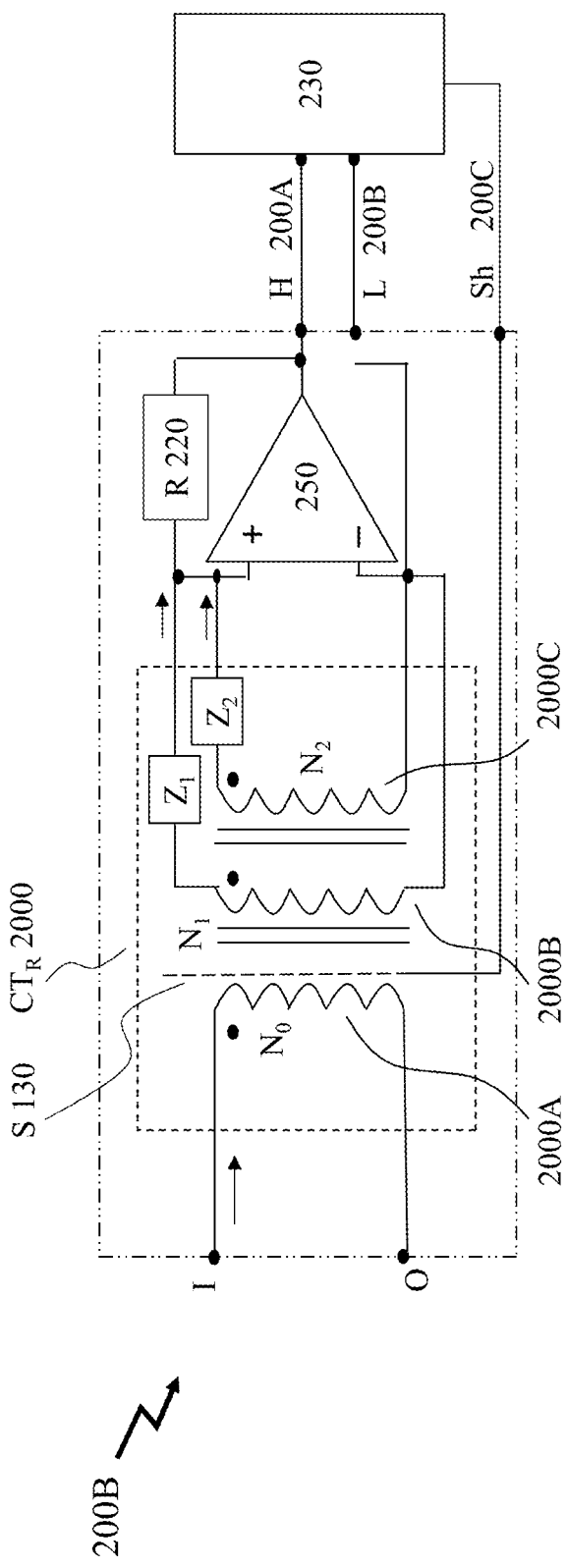
FIG. 2B depicts a circuit using dual stage AC current transducers with a transimpedance amplifier to sum the currents from the first and second stages.

Referring to FIG. 2B there is depicted a dual stage transducer 200B wherein a current transducer $CT_R$ 2000 again comprises primary winding 2000A and secondary and correction windings 2000B and 2000C respectively with the shield 130 disposed between the primary winding 2000A and the magnetic core of the current transducer 2000 and coupled via shield port Sh 200C to circuit 230. However, in dual stage transducer 200B the non-inductive four terminal shunt R 210 employed within dual stage transducer 200A in FIG. 2A is replaced by a transimpedance amplifier (TIA) 250 with feedback resistor 220. As depicted one side of each the secondary and correction windings 200A and 200B respectively are coupled to the positive input port of the TIA 250 whilst the negative input port of the TIA 250 is coupled to the other side of each the secondary and correction windings 200A and 200B respectively. The output of the TIA 250 being coupled to first output port 200A whilst the sides of the secondary and correction windings 200A and 200B respectively are coupled to the second output port 200B.

However, in many test and measurement applications even the enhanced current reproduction and error reduction of dual stage transducers 200A and 200B is insufficient. The continued drive for improved accuracy in calibration, standards, and measurements on circuits and components operating at hundreds of kilovolts, thousands of Amps, with resistances into Gigaohms at accuracies of parts per million is being replaced by accuracies of parts per billion. Accordingly, referring to FIG. 3A there is depicted a dual stage transducer 300 according to an embodiment of the invention employing a $CT_R$ 2000 in conjunction with first and second four (4) terminal resistors (4TeR) 310 and 320 respectively. As depicted the secondary current from the secondary winding 2000B is connected to the first 4TeR 310 and the second secondary current from the correction winding 2000C is connected to the second 4TeR 320, e.g. the magnetizing current of the first stage transducer is coupled to this resistor. If, now the first and second 4TeR 310 and 320 are serially connected on their voltage measurement terminals then the sum of these two voltages are an accurate replica of the current being measured. This arises in part due to the fact, that the required induced voltage in the second core of the $CT_R$ 2000 is much smaller and consequently the remaining error of the magnetizing current of the second stage is negligible.

Within some embodiments of the invention the second stage (correction) current and voltage within the dual stage transducer are small and accordingly, depending upon the precision of the source, measurement circuit, etc. that they form part of, the precision 4TeR 320 may be replaced with a suitably tolerance two terminal resistor.

Optionally, to obtain an even more accurate voltage proportional to the magnetizing current of the second stage an amplifier, e.g. an electronic amplifier, may be employed such that the voltage across the correction winding 2000C is reduced even further. Accordingly, the error due to the magnetizing current of the second stage, which is related to the voltage drop on the impedance of that correction winding, denoted $Z_2$, is negligible because this current is small but the error due to the voltage on the prior art four-terminal shunt resistor R 210 is significant.

In addition to improved accuracy in calibration, standards, and measurements on circuits and components arising from the measurement circuits themselves a corresponding drive in improved accuracy exists in the design and implementation of precision sources of alternating current within test and measurement instrumentation. Whilst this may appear a different problem to that of the measurement circuit the inventors have realized that actually the technique to solve it is similar to that depicted in FIG. 3A in respect of enhanced accuracy current measurements. Accordingly, referring to FIG. 3B there is depicted a precision AC current source (PACCS) 350 according to an embodiment of the invention exploiting a current transducer $CT_R$ 2000 such as described supra in respect of FIG. 3A. Accordingly, a controlled current source 410 has been inserted into the circuit loop comprising secondary winding 2000B and first 4TeR R1 310. The controlled current source 410 is coupled to the control circuit 430 via control port 400C. Beneficially the PACCS 350 allows a voltage proportional to the output current of an AC transconductance amplifier to be precisely obtained without the measuring equipment being connected to the output circuit. As the controlled current source 410 is coupled to the secondary winding 2000B and the load Z 420 is coupled across the primary winding 2000A then strictly the secondary winding 2000B is the "primary winding" and primary winding 2000A the "secondary winding" of the PACCS 350 whilst the correction winding is essentially unchanged.

Accordingly, feedback information for the regulation of the controlled current source 410 within the PACCS 350 is derived from the output of the PACCS 350, this being the voltage on the first 4TeR R1 310 from which is subtracted the voltage on the second 4TeR R2 320 generated by the current flowing within a second current loop comprising second 4TeR R2 320 and correction winding 2000C of the $CT_R$ 2000. Accordingly, this output voltage V across terminals 400A and 400B is proportional to the output current and hence can be used as feedback information. It would be evident that measuring this output voltage V using an analog-to-digital converter (ADC) would allow the value of the output secondary current to be obtained in digital form for use within a digital feedback loop to the programmable current source 410. Alternatively, an analog feedback loop may be employed but it should be emphasized that in either instance the current is measured without connecting any measuring device in the output circuit, a very significant feature against prior art precision current sources with feedback. Further, the problem of generating and measuring even very large currents are addressed without the requirement for using shunts.

Figure 4A:
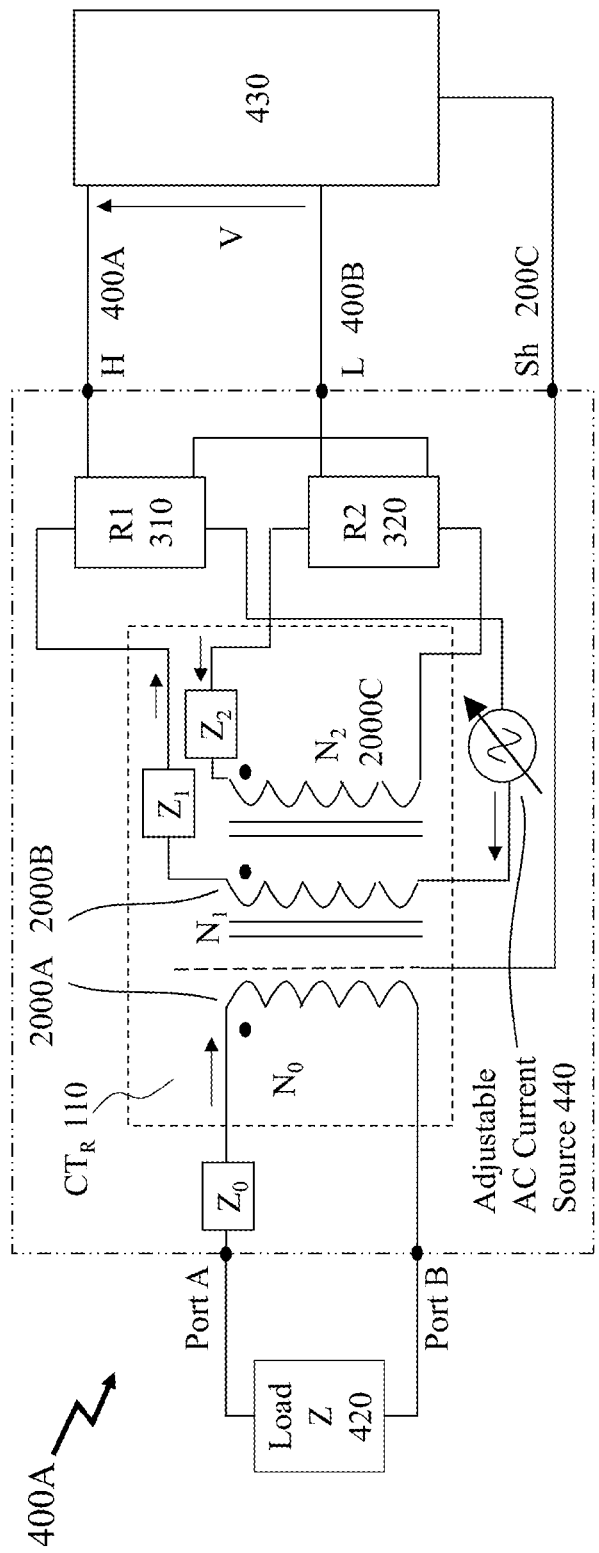
FIG. 4A depicts a precision AC current source exploiting a dual stage current transducer, dual independent load resistors, and with an adjustable uncontrolled current source according to an embodiment of the invention transducer.
Figure 4B:
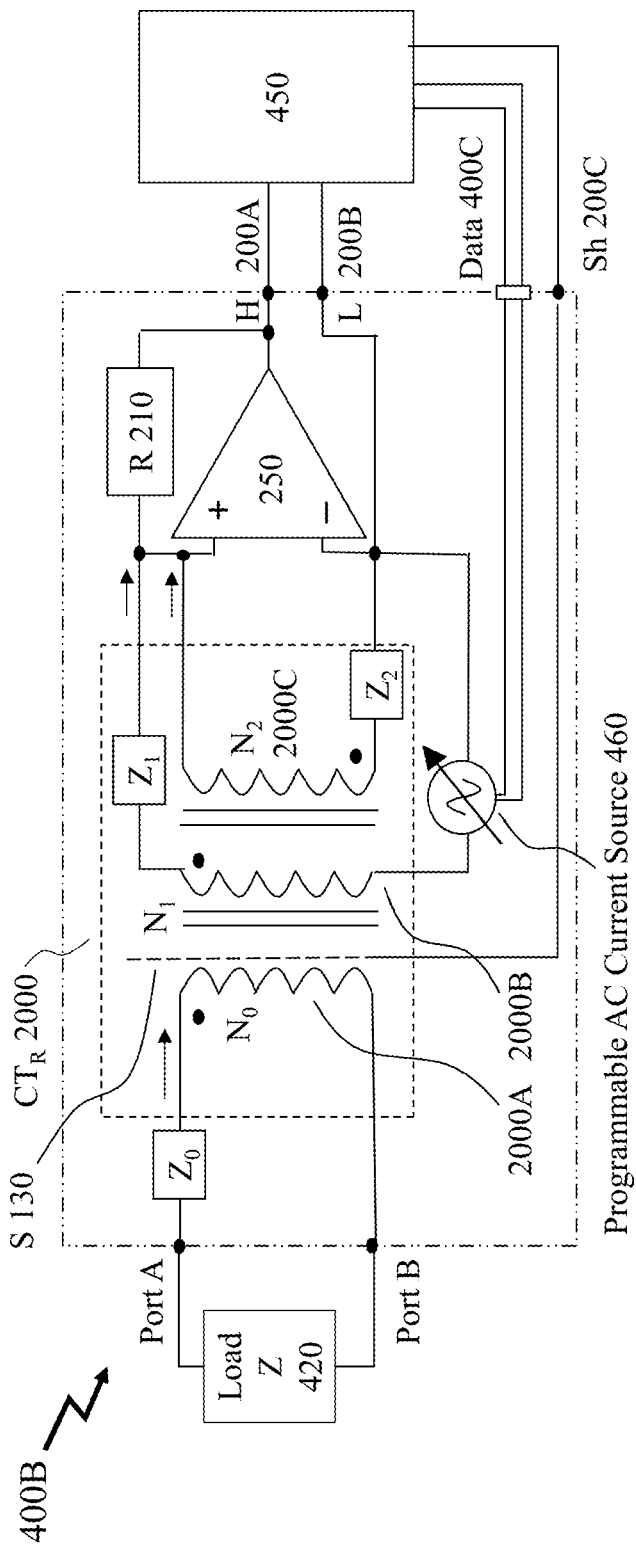
FIG. 4B depicts a precision AC current source exploiting a dual stage current transducer with adjustable uncontrolled current source and a transimpedance amplifier to sum the currents from the first and second stages according to an embodiment of the invention.

Within some embodiments of the invention, such as depicted by first and second PACCS 400A and 400B respectively in FIGS. 4A and 4B, the controlled current source 410 which is part of a feedback control loop for the PACCS 350 may be replaced by adjustable and programmable AC current sources 440 and 460 respectively. As depicted in FIG. 4A first PACCS 400A which exploits first 4TeR R1 310 and second 4TeR R2 320 in conjunction with adjustable AC current source 440 is not coupled to the control circuit 430. However, the signal level of the adjustable AC current source 440 may be set, thereby setting the output current supplied to load Z 420, such that subsequently the value of the current is measured, and this is then used for calibration by the control circuit 430. In contrast in FIG. 4B second PACCS 400B exploits programmable AC current source 460 which is programmed via a digital control word through data port 400C allowing the control circuit 430 to establish multiple settings for the PACCS 400B. Accordingly, the load Z 420 is driven at multiple output currents/voltages and feedback to the control circuit 450 is achieved through TIA 250.

Figure 3A:
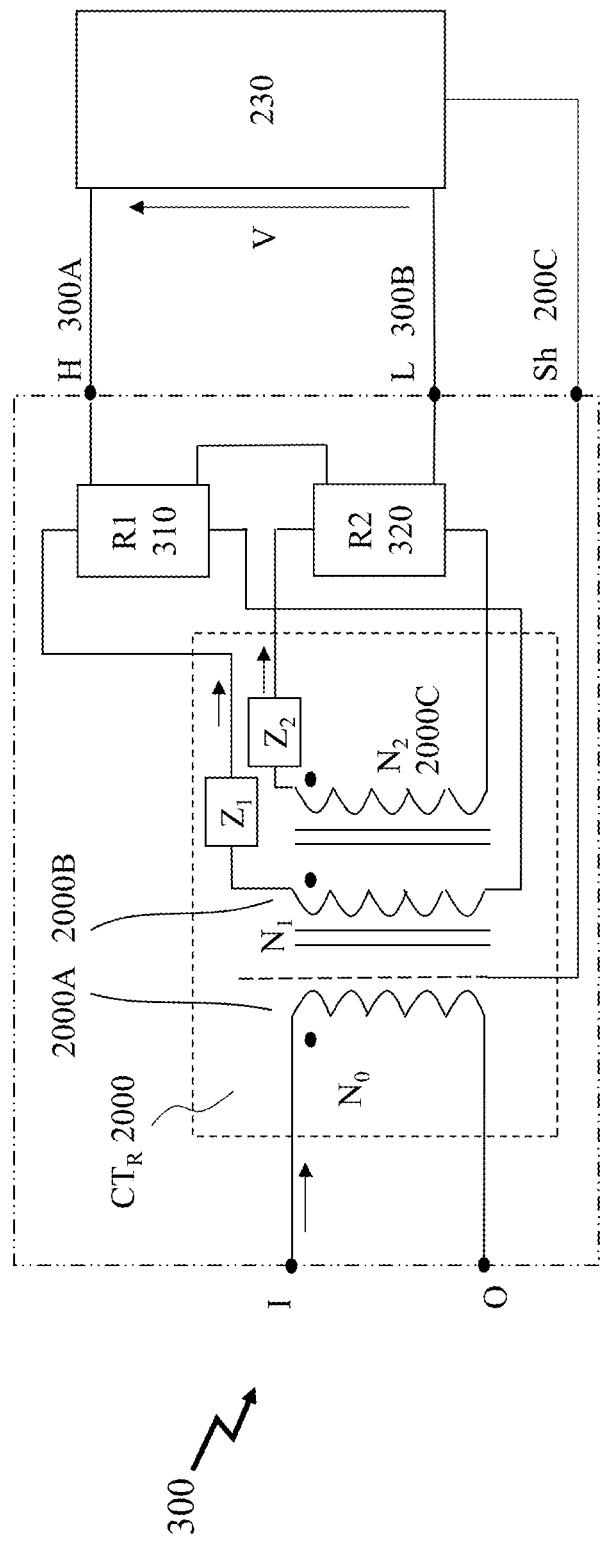
FIG. 3A depicts an AC dual stage current transducer using dual independent resistors for improved accuracy according to an embodiment of the invention.
Figure 3B:
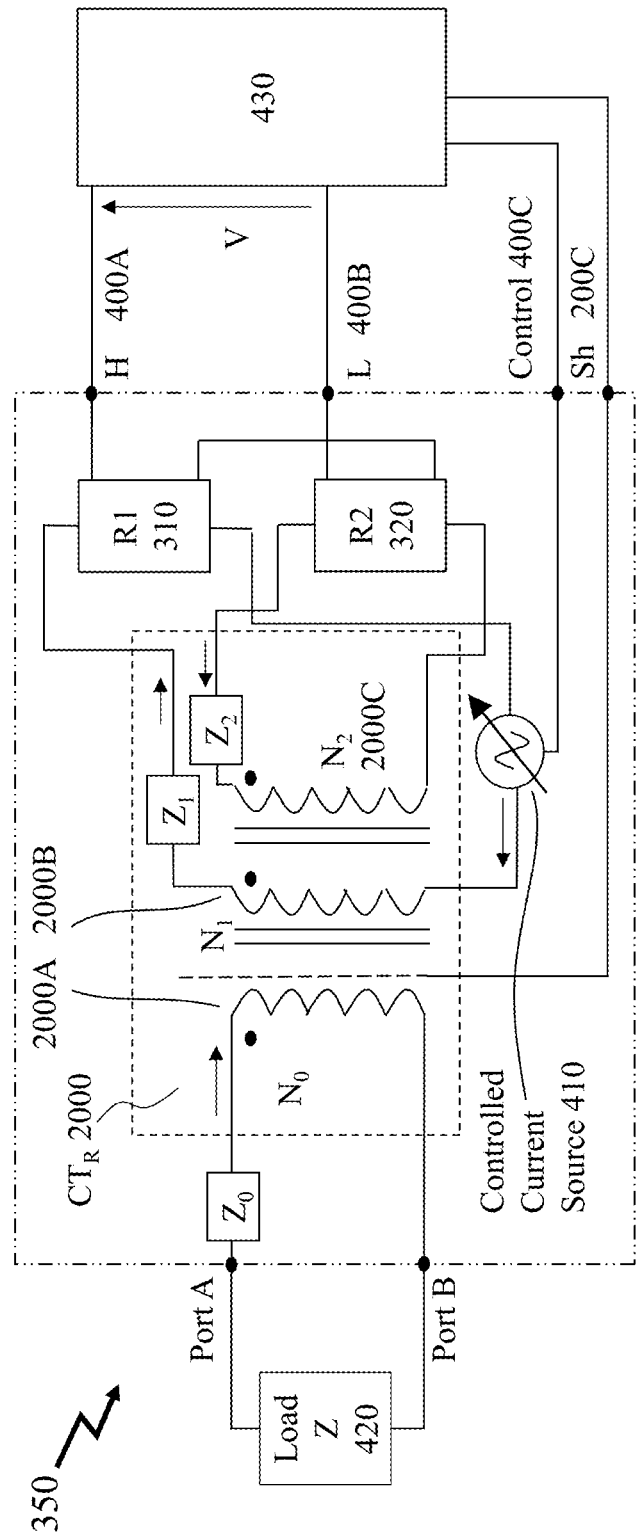
FIG. 3B depicts a precision AC current source exploiting a dual stage current transducer, dual independent load resistors, and a programmable controlled current source according to an embodiment of the invention.

Accordingly, referring to FIGS. 3B, 4A and 4B there are depicted precision AC current sources (PACCS) 350, 400A and 400B respectively according to an embodiment of the invention exploiting a current transducer $CT_R$ 2000 such as described supra. Beneficially each of PACCS 350, 400A, and 400B allow a voltage proportional to the output current of the PACCS to be precisely obtained without requiring that precision measuring equipment is connected to the output circuit together with the load Z 420s.

The embodiments of the invention described above in respect of FIGS. 2A through 4B assume that the voltage induced in the uniformly wound coil on the toroidal magnetic core of the $CT_R$ 2000 is proportional to the total ampere-turns passing through the opening of that magnetic core and consequently that only the magnetizing current is causing the error. However, with the development of the current comparator, see for example Miljanic et al. in "The Development of the Current Comparator: A High Accuracy AC Ratio Measuring Device" (IEEE Part 1: Comm. & Elect., Vol 81 (5), pp 359-368), it was shown that the voltage induced in the winding wound on the toroidal magnetic core measures the total ampere-turn passing through its opening only if it is shielded from stray magnetic and electric fields. Accordingly, for embodiments of the invention as described in respect of FIG. 6 below a shield, for example a hollow toroid of the magnetic material which surrounds the measuring core situated in its interior and/or a copper tape/box for electrical shielding.

It would be evident to one skilled in the art that the PACCS 400 may be considered as a combination of a dual stage current transducer and a shielded current comparator wherein the magnetic shield of the current comparator is used as the magnetic core of the first stage of the dual stage current transducer, and the detection winding of the current comparator is actually the second stage of the dual stage current transducer.

Figure 5A:
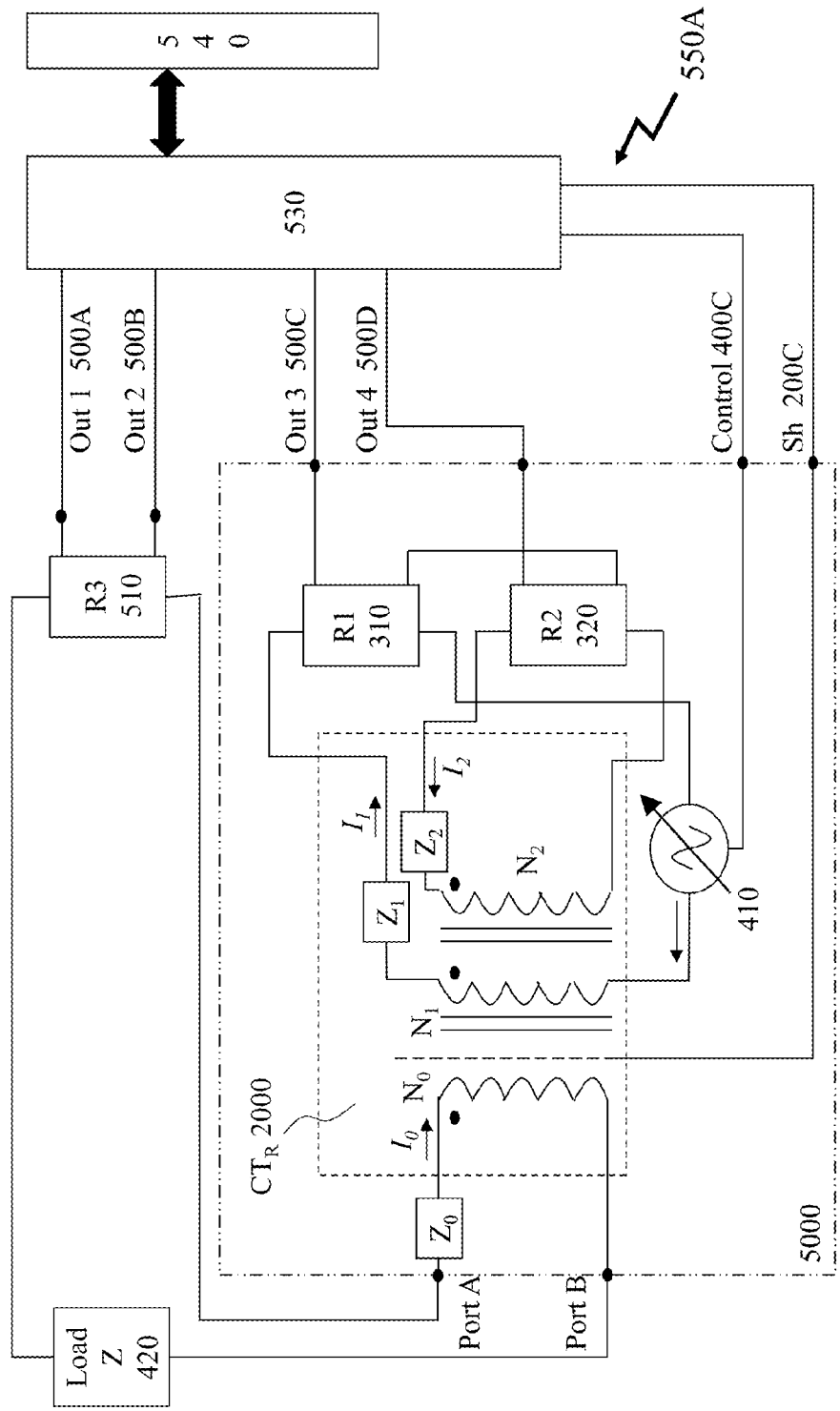
FIGS. 5A through 5C depict high current AC shunt calibrators according to embodiments of the invention exploiting a dual stage current transducers

Referring to FIG. 5A there is depicted an AC shunt calibrator 550A, particularly for their calibration at high current. Accordingly, as depicted a PACCS 5000, which is depicted as PACCS 350 in FIG. 3B with controlled current source 410 disposed within the circuit comprising the secondary winding of a $CT_R$ 2000 in conjunction with first 4TeR R1 310. The calibration AC shunt R3 510 is a 4 terminal resistor wherein the other terminals are coupled to the control circuit 530 as Out 1 and Out 2 at ports 500A and 500B respectively. The H and L outputs from PACCS 350 are now depicted as Out 3 and Out 4 at ports 500C and 500D respectively which are also coupled to the control circuit 530. Also connected to PACCS 350 from the control circuit 530 are Shy 200C for the shield within $CT_R$ 2000 and control 400C whilst a microprocessor 540 is coupled to the control circuit 530. Accordingly, the AC shunt calibrator 550A can be calibrated over a range of test conditions, established through the setting of the controlled current source 410 under the action of the control circuit 530, by determining the current via Out 3 and Out 4 on ports 500C and 500D together with the voltage across the calibration AC shunt 510 via Out 1 and Out 2 on ports 500A and 500B. These may be measured using two independent voltmeters (or ADCs). This configuration provides flexibility in where and if a common ground connection is made.

Figure 5B:
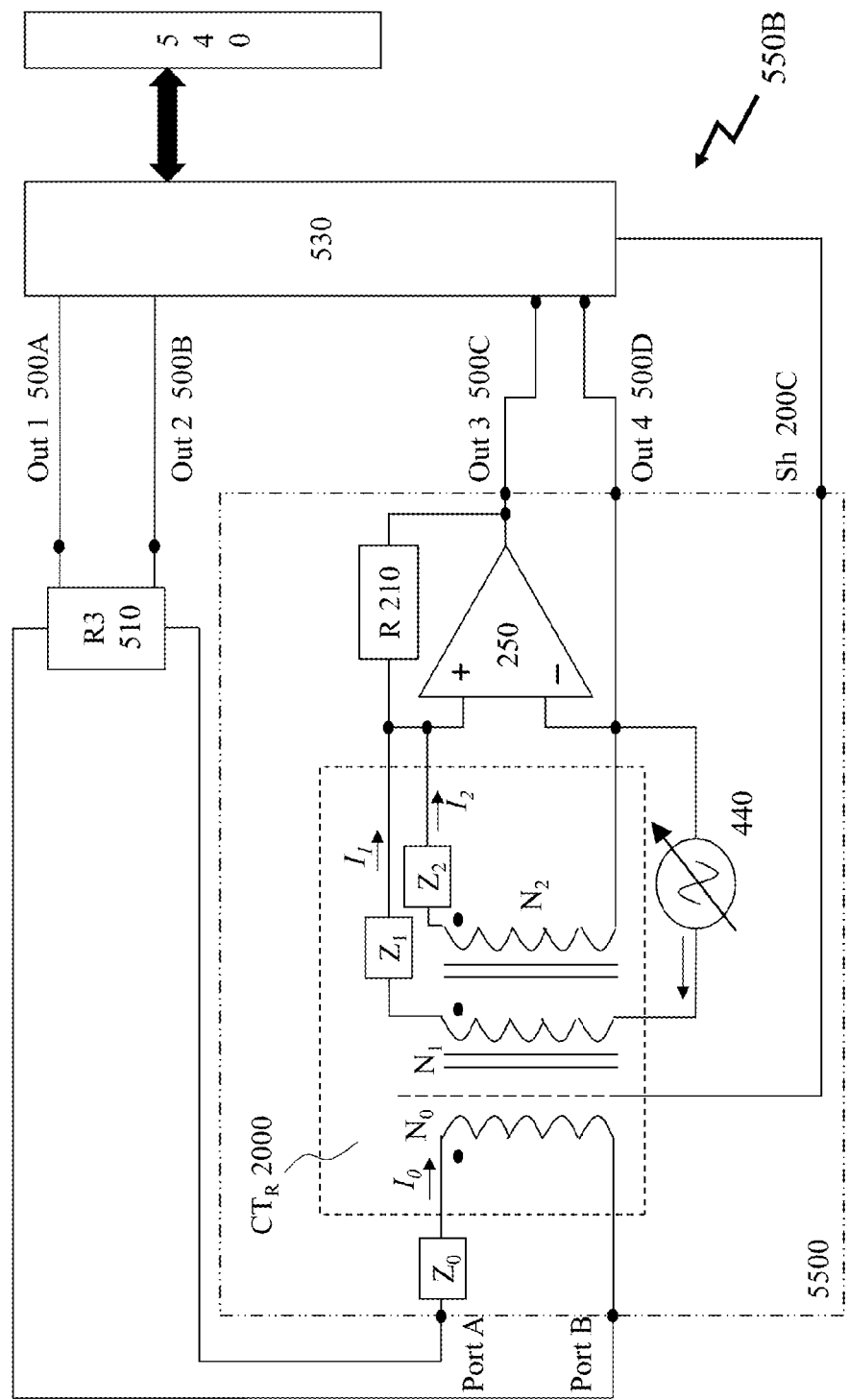
Figure 5C:
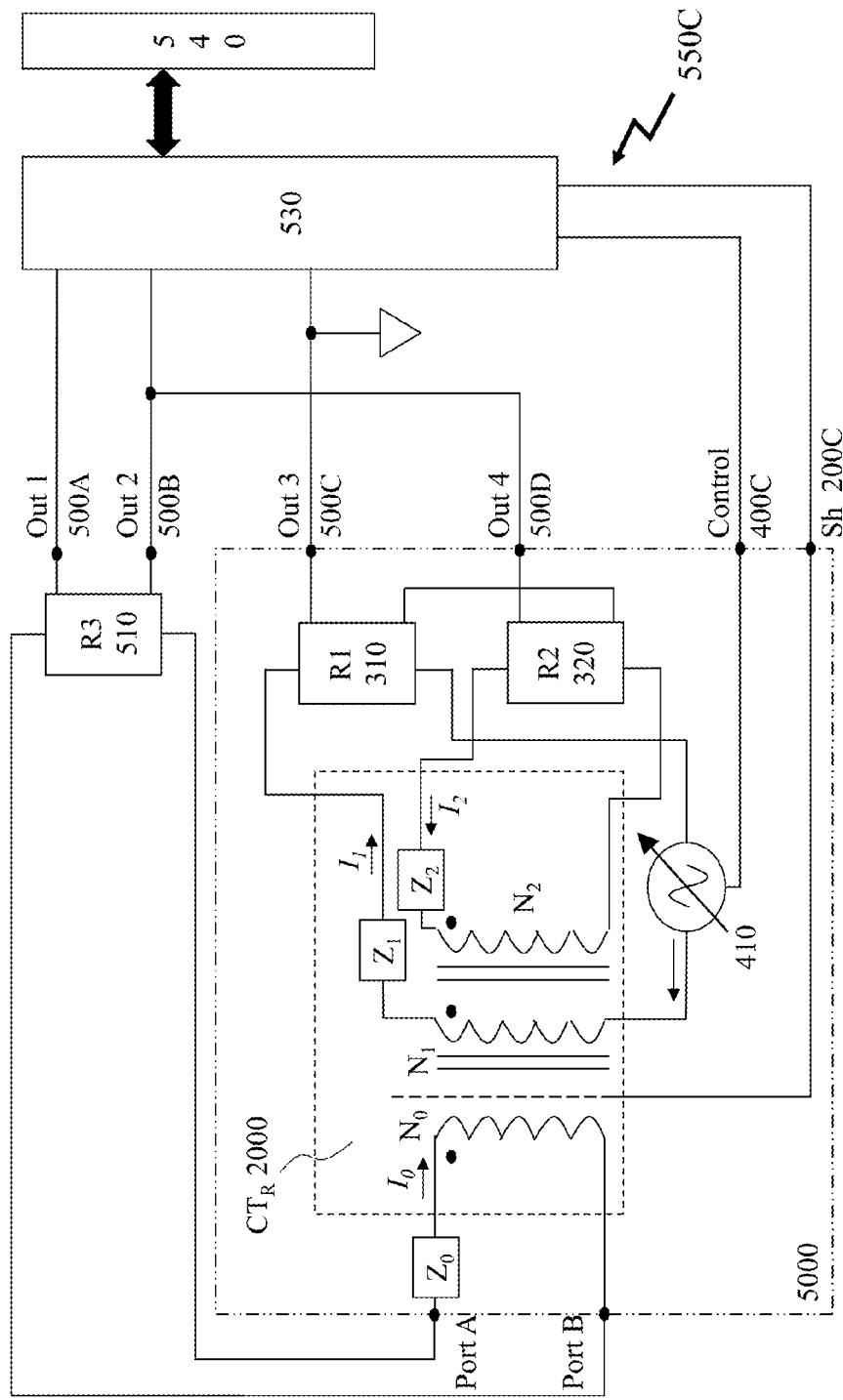

Now referring to FIG. 5B there is depicted an AC shunt calibrator 550B according to an embodiment of the invention wherein PACCS 5500, which is depicted as comprising PACCS 400B in FIG. 4B except that the programmable AC current source 460 has been replaced with adjustable AC current source 440 such that there is no control/data signal to the current source within the PACCS 5500 from the control circuit 530. Referring to FIG. 5C there is depicted a variant of AC shunt calibrator 550A in AC shunt calibrator 550C wherein output Out 3 500C, coupled to first 4TeR R1 310 is still coupled to control circuit 530 but is grounded.

However, now Out 4 500D, which is coupled to second 4TeR R2 320, is coupled with Out 2 500B and therein the control circuit 530 rather than directly to the control circuit. Accordingly, variations in the output of the PACCS 5000 which are applied to the Load Z 420 under test are automatically applied to the measured current flowing in the load circuit via third 4TeR R3 510.

Within the embodiments of the invention depicted supra in respect of precision AC current sources FIGS. 3A, 4A and 4B and exploited within the AC shunt calibrators 550A to 550C in FIGS. 5A to 5C respectively current sources are employed in conjunction with the secondary winding. However, in other embodiments of the invention these current sources may be an AC power source in order to drive power shunts during calibration. Such AC power sources may range from 50 W to 1000 W, for example.

Figure 6:
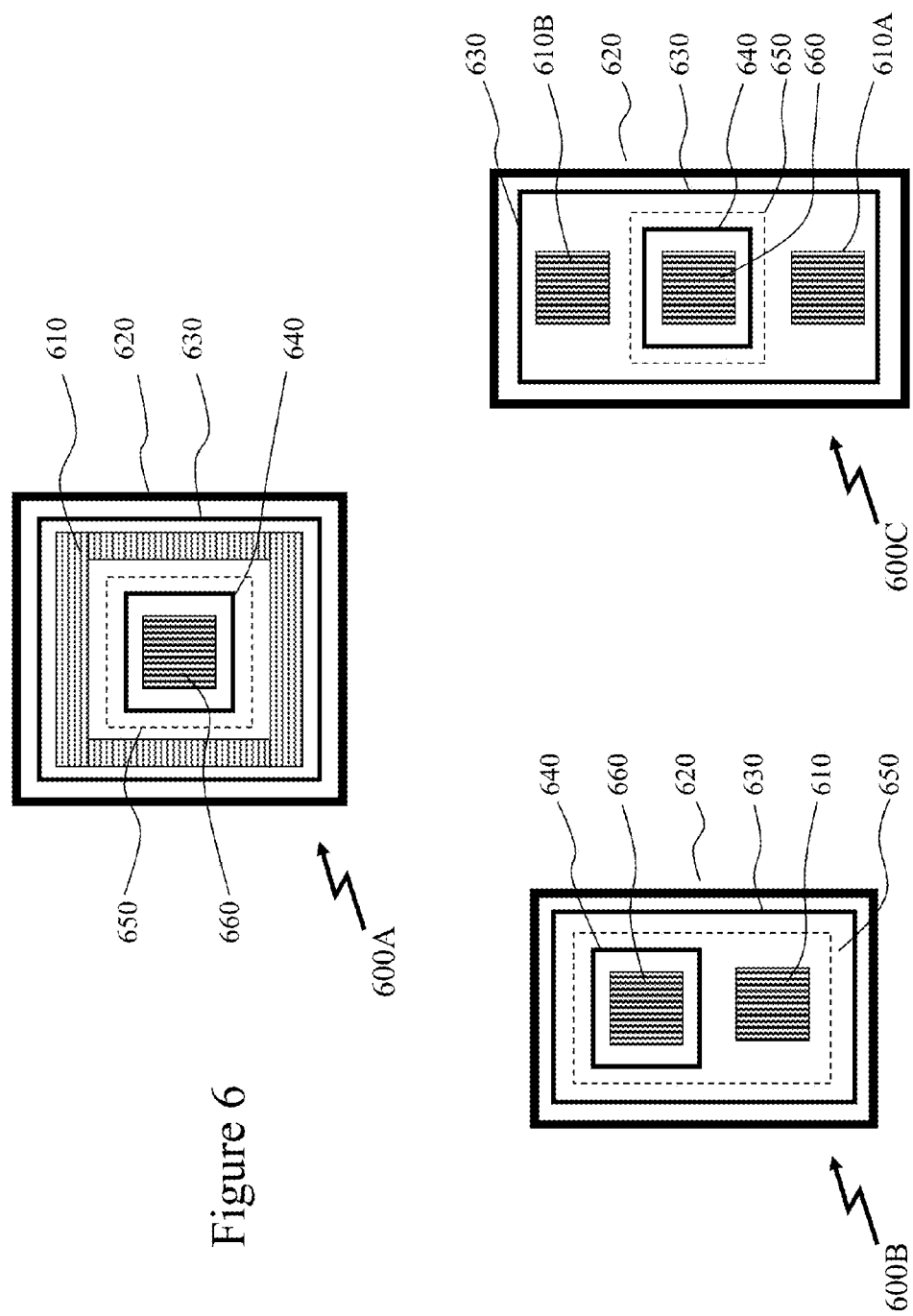
FIG. 6 depicts dual stage current transducer designs exploiting core-in-core, dual core, and triple core designs to provide AC devices according to embodiments of the invention as described in respect of FIGS. 2A through 5B.

Referring to FIG. 6 there are depicted first to third dual stage current transducers ($2SCT_R$) 600A to 600C respectively designs exploiting core-in-core, dual core, and triple core designs respectively to provide AC devices according to embodiments of the invention as described in respect of FIGS. 2 through 5. Referring to first $2SCT_R$ 600A a magnetic shield, the first stage magnetic core 610, has wound around it primary winding 620 and secondary winding 630. Disposed within the magnetic shield are electric shield 650 and correction winding 640 which surround measuring toroid, second stage magnetic core 660.

Second $2SCT_R$ 600B depicts the same elements except that now the first stage magnetic core 610 and second stage magnetic core 660 are a pair of parallel toroids wherein the primary winding 620 and secondary winding 630 surround both as does the electrical shield 650. The correction winding 640 then surrounds only the second stage magnetic core 660. Similarly in third $2SCT_R$ 600C depicts the same elements except that now the first stage magnetic core comprises first and second core elements 610A and 610B respectively and these, in conjunction with the second stage magnetic core 660 are a triplet of parallel toroids. Accordingly, in third $2SCT_R$ 600C the primary winding 620 and secondary winding 630 surround the first and second core elements 610A and 610B and second stage magnetic core 660. The electrical shield 650 surrounds only the second stage magnetic core 660 as does the correction winding 640. Other embodiments of a $2SCT_R$ may be envisioned without departing from the scope of the invention.

Figure 7:
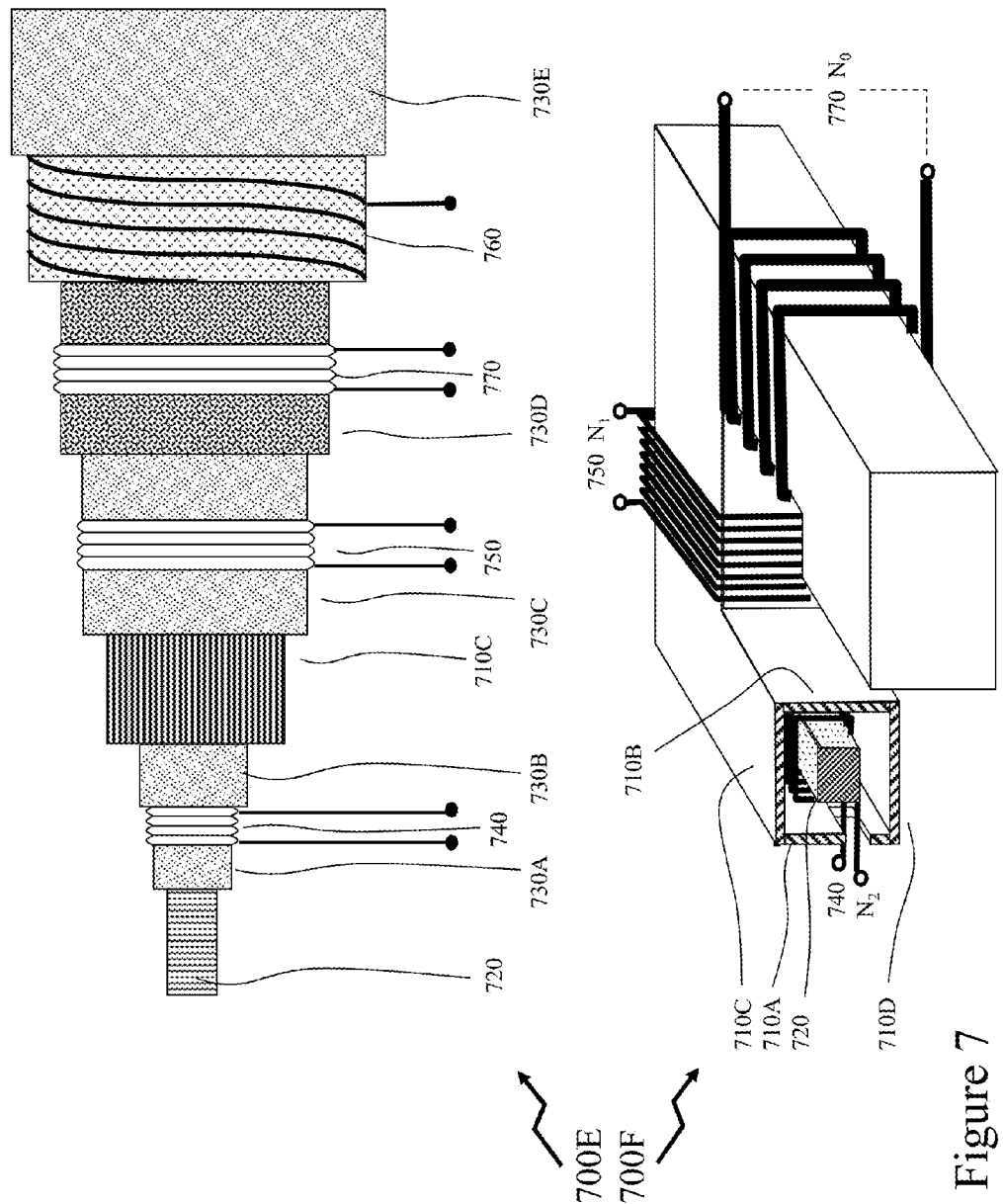
FIG. 7 depicts a dual stage current transducer design exploiting a core-in-core design to provide AC devices according to embodiments of the invention as described in respect of FIGS. 2A through 5B.

FIG. 7 depicts a dual stage current transducer ($2SCT_R$) design exploiting a core-in-core design to provide AC devices according to embodiments of the invention as described in respect of FIGS. 2 through 5 and first $2SCT_R$ 600A. Accordingly first image 700C depicts the $2SCT_R$ sequentially stripped from the outermost layer towards the centre whilst second image 700D depicts a three dimensional quarter-cut sectional view with first to fifth tape layers 730A through 730E respectively and shielding 760 removed for clarity. Accordingly as shown the $2SCT_R$ comprises a first core comprising first to fourth core elements 710A to 710D respectively surround a second core 720. Second core 720 then has first tape layer 730A separating the first winding 740 from it which is then overwound with second tape layer 730B. The first core (first to fourth core elements 710A to 710D) and second core 720 respectively with their respective surrounding layers are then overwound with third tape layer 730C. Atop third tape layer 730C second winding 750 is wound around first core (first to fourth core elements 710A to 710D) and second core 720. Second winding 750 is then overwound by fourth tape layer 730D, shielding 760, fifth tape layer 730E and third winding 770.

As depicted first winding 740 corresponds to correction winding $N_2$ of FIG. 10, second winding 750 corresponds to secondary winding $N_1$ of FIG. 10, and third winding 770 corresponds to the primary winding $N_0$ of FIG. 10. Optionally a second shielding may be disposed between the first and second windings 740 and 750 respectively such as between second and third tape layers 730B and 730C respectively. Second image 700D depicts a three dimensional quarter-cut sectional view with first to fifth tape layers 730A through 730E respectively and shielding 760 removed thereby showing how the first to third windings 740, 750 and 770 respectively are wound around the closed magnetic elements forming the first, second, and third cores 710A, 720, and 710B respectively. It would be evident to one skilled in the art that the number of windings for each of the first to third windings 740, 750, and 770 respectively and geometries of the first core (first to fourth core elements 710A to 710D) and second core 720 respectively may be adjusted according to the electrical voltage, current and power of the signal being measured and/or generated.

Figure 8:
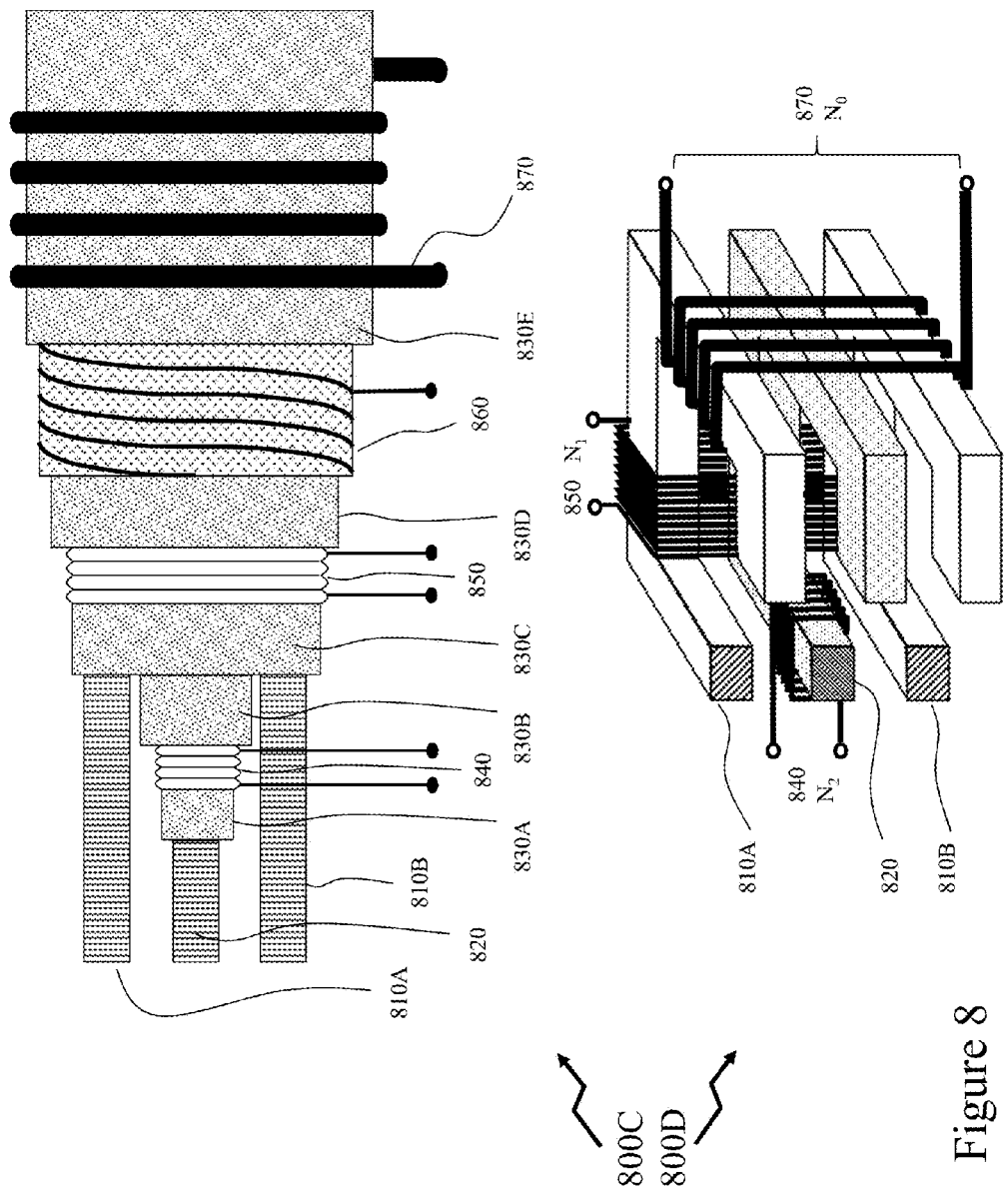
FIG. 8 depicts a dual stage current transducer design exploiting a three core design to provide AC devices according to embodiments of the invention as described in respect of FIGS. 2A through 5B.

FIG. 8 depicts a dual stage current transducer ($2SCT_R$) design exploiting a three-core design to provide AC devices according to embodiments of the invention as described in respect of FIGS. 2 through 5 and third $2SCT_R$ 600C. Accordingly first image 800C depicts the CT sequentially stripped from the outermost layer towards the centre whilst second image 800D depicts a three dimensional quarter-cut sectional view with first to fifth tape layers 830A through 830E respectively and shielding 860. Accordingly as shown the CT comprises first, second, and third cores 810A, 820, and 810B respectively. Second core 820 then has first tape layer 830A separating the first winding 840 from it which is then overwound with second tape layer 830B. The first, second, and third cores 810A, 820, and 810B respectively with their respective surrounding layers are then overwound with third tape layer 830C. Atop third tape layer 830C second winding 850 is wound around first, second, and third cores 810A, 820, and 810B respectively. Second winding 850 is then overwound by fourth tape layer 830D, shielding 860, fifth tape layer 830E and third winding 870. As depicted first winding 840 corresponds to correction winding $N_2$ of FIG. 10, second winding 850 corresponds to secondary winding $N_1$ of FIG. 10, and third winding 870 corresponds to the primary winding $N_0$ of FIG. 10. Optionally a second shielding may be disposed between the first and second windings 840 and 850 respectively such as between second and third tape layers 830B and 830C respectively.

Second image 800D depicts a three dimensional quarter-cut sectional view with first to fifth tape layers 830A through 830E respectively and shielding 860 removed thereby showing how the first to third windings 840, 850 and 870 respectively are wound around the closed magnetic elements forming the first, second, and third cores 810A, 820, and 810B respectively. It would be evident to one skilled in the art that the number of windings for each of the first to third windings 840, 850, and 870 respectively and geometries of the first, second, and third cores 810A, 820, and 810B respectively may be adjusted according to the electrical voltage, current and power of the signal being measured and/or generated.

Specific details are given in the above description to provide a thorough understanding of the embodiments. However, it is understood that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A current source comprising:
   a dual stage current transducer comprising at least a primary winding, a first secondary winding and a second secondary winding;
   an alternating current source disposed between the first secondary winding and a processing circuit for generating a current to generate a first electrical output signal across the primary winding to be coupled to a load;
   a processing circuit coupled to the first secondary winding and the second secondary winding for providing a second electrical output signal relating to the current generated by the alternating current source to an external circuit.

2. The current source according to claim 1, wherein
   the processing circuit comprises a first four terminal shunt and a second four terminal shunt; wherein
   a first current lead of the first four terminal shunt is coupled to a first predetermined end of the first secondary winding and a second current lead of the first four terminal shunt is coupled to the other end of the first secondary winding via the alternating current source;
   a first current lead of the second four terminal shunt is coupled to a first end of the second secondary winding corresponding to the first end of the first secondary winding and a second current lead of the second four terminal shunt is coupled to the other end of the second secondary winding;
   a first voltage lead of the first four terminal shunt at the same end as the first current lead of the first four terminal shunt is coupled to the external circuit;
   a first voltage lead of the second four terminal shunt at the same end as the second current lead of the second four terminal shunt is coupled to the external circuit; and
   the second voltage leads of the first and second four terminal shunts are coupled together.

3. The current source according to claim 1, wherein
   the processing circuit comprises a current comparator having a first input, a second input, and an output; and
   a resistor disposed between the first input of the current comparator and the output of the current comparator which is also coupled to the external circuit; wherein
   the first input of the current comparator is coupled to a first predetermined end of the first secondary winding and a first predetermined end of the second secondary winding corresponding to the first end of the first secondary winding;
   the second input of the current comparator is coupled to the other end of the second secondary winding and to the other end of the first secondary winding via the alternating current source.

4. The current source according to claim 1, wherein the alternating current source is selected from the group comprising a stabilized alternating current source, an adjustable alternating current source, a programmable alternating current source and a controllable alternating current source.

5. The current source according to claim 1, further comprising
   a third four terminal shunt coupled in series with a load across the primary winding; and
   the processing circuit comprises a first four terminal shunt and a second four terminal shunt; wherein
   a first current lead of the first four terminal shunt is coupled to a first predetermined end of the first secondary winding and a second current lead of the first four terminal shunt is coupled to the other end of the first secondary winding via the alternating current source;
   a first current lead of the second four terminal shunt is coupled to a first end of the second secondary winding corresponding to the first end of the first secondary winding and a second current lead of the second four terminal shunt is coupled to the other end of the second secondary winding;
   a first current lead of the third four terminal shunt is coupled to the primary winding at the end corresponding to the first end of the first secondary winding and a second current lead of the third four terminal shunt is coupled to the other end of the primary winding via the load;
   a first voltage lead of the first four terminal shunt at the same end as the first current lead of the first four terminal shunt is coupled to ground and the external circuit;
   a first voltage lead of the second four terminal shunt is coupled to a second voltage lead of the second terminal shunt at the same end as the second current lead of the second terminal shunt and the external circuit;
   a first voltage lead of the second four terminal shunt at the same end as the second current lead of the second four terminal shunt is coupled to the external circuit;
   the second voltage leads of the first and second four terminal shunts are coupled together;
   a first voltage lead of the third four terminal shunt at the same end as the first current lead of the third four terminal shunt is coupled to the external circuit; and
   a second voltage lead of the second four terminal shunt is coupled to a second voltage lead of the third four terminal shunt and to the external circuit.

6. The current source according to claim 1, further comprising
   the processing circuit comprises a current comparator having a first input, a second input, and an output;
   a resistor disposed between the first input of the current comparator and the output of the current comparator which is also coupled to the external circuit; and a four terminal shunt coupled in series with a load across the primary winding; wherein the first input of the current comparator is coupled to a first predetermined end of the first secondary winding and a first predetermined end of the second secondary winding corresponding to the first end of the first secondary winding;

the second input of the current comparator is coupled to the other end of the second secondary winding and to the other end of the first secondary winding via the alternating current source;

a first current lead of the third four terminal shunt is coupled to the primary winding at the end corresponding to the first end of the first secondary winding and a second current lead of the four terminal shunt is coupled to the other end of the primary winding via the load;

a first voltage lead of the four terminal shunt at the same end as the first current lead of the four terminal shunt is coupled to the external circuit; and a second voltage lead of the four terminal shunt is coupled to a second voltage lead of the four terminal shunt and to the external circuit.

7. The current source according to claim 1, further comprising a third four terminal shunt coupled in series with a load across the primary winding; and the processing circuit comprises a first four terminal shunt and a second four terminal shunt; wherein a first current lead of the first four terminal shunt is coupled to a first predetermined end of the first secondary winding and a second current lead of the first four terminal shunt is coupled to the other end of the first secondary winding via the alternating current source;

a first current lead of the second four terminal shunt is coupled to a first end of the second secondary winding corresponding to the first end of the first secondary winding and a second current lead of the second four terminal shunt is coupled to the other end of the second secondary winding;

a first current lead of the third four terminal shunt is coupled to the primary winding at the end corresponding to the first end of the first secondary winding and a second current lead of the third four terminal shunt is coupled to the other end of the primary winding via the load;

a first voltage lead of the first four terminal shunt at the same end as the first current lead of the first four terminal shunt is coupled to the external circuit;

a first voltage lead of the second four terminal shunt at the same end as the first current lead of the first four terminal shunt is coupled to the external circuit;

a first voltage lead of the second four terminal shunt at the same end as the second current lead of the second four terminal shunt is coupled to the external circuit;

the second voltage leads of the first and second four terminal shunts are coupled together;

a first voltage lead of the third four terminal shunt at the same end as the first current lead of the third four terminal shunt is coupled to the external circuit; and a second voltage lead of the second four terminal shunt is coupled to a second voltage lead of the third four terminal shunt and to the external circuit.

8. A method of providing a current source comprising:

providing a dual stage current transducer comprising at least a primary winding, a first secondary winding and a second secondary winding;

providing an alternating current source disposed between the first secondary winding and a processing circuit for generating a current to generate a first electrical output signal across the primary winding to be coupled to a load;

providing a processing circuit coupled to the first secondary winding and the second secondary winding for providing a second electrical output signal relating to the current generated by the alternating current source to an external circuit.

9. The method of providing a current source according to claim 8, wherein the processing circuit comprises providing a first four terminal shunt and a second four terminal shunt; wherein a first current lead of the first four terminal shunt is coupled to a first predetermined end of the first secondary winding and a second current lead of the first four terminal shunt is coupled to the other end of the first secondary winding via the alternating current source;

a first current lead of the second four terminal shunt is coupled to a first end of the second secondary winding corresponding to the first end of the first secondary winding and a second current lead of the second four terminal shunt is coupled to the other end of the second secondary winding;

a first voltage lead of the first four terminal shunt at the same end as the first current lead of the first four terminal shunt is coupled to the external circuit;

a first voltage lead of the second four terminal shunt at the same end as the second current lead of the second four terminal shunt is coupled to the external circuit; and the second voltage leads of the first and second four terminal shunts are coupled together.

10. The method of providing a current source according to claim 8, wherein providing the processing circuit comprises providing a current comparator having a first input, a second input, and an output with a resistor disposed between the first input of the current comparator and the output of the current comparator which is also coupled to the external circuit; wherein the first input of the current comparator is coupled to a first predetermined end of the first secondary winding and a first predetermined end of the second secondary winding corresponding to the first end of the first secondary winding;

the second input of the current comparator is coupled to the other end of the second secondary winding to the other end of the first secondary winding via the alternating current source.

11. The method of providing a current source according to claim 8, wherein providing the alternating current source is selected from the group comprising a stabilized alternating current source, an adjustable alternating current source, a programmable alternating current source and a controllable alternating current source.

12. The method of providing a current source according to claim 8, further comprising;

a third four terminal shunt coupled in series with a load across the primary winding; wherein providing the processing circuit comprises providing a first four terminal shunt and a second four terminal shunt;

a first current lead of the first four terminal shunt is coupled to a first predetermined end of the first secondary winding and a second current lead of the first four terminal shunt is coupled to the other end of the first secondary winding via the alternating current source;

a first current lead of the second four terminal shunt is coupled to a first end of the second secondary winding corresponding to the first end of the first secondary winding and a second current lead of the second four terminal shunt is coupled to the other end of the second secondary winding;

a first current lead of the third four terminal shunt is coupled to the primary winding at the end corresponding to the first end of the first secondary winding and a second current lead of the third four terminal shunt is coupled to the other end of the primary winding via the load;

a first voltage lead of the first four terminal shunt at the same end as the first current lead of the first four terminal shunt is coupled to ground and the external circuit;

a first voltage lead of the second four terminal shunt is coupled to a second voltage lead of the second terminal shunt at the same end as the second current lead of the second terminal shunt and the external circuit;

a first voltage lead of the second four terminal shunt at the same end as the second current lead of the second four terminal shunt is coupled to the external circuit;

the second voltage leads of the first and second four terminal shunts are coupled together;

a first voltage lead of the third four terminal shunt at the same end as the first current lead of the third four terminal shunt is coupled to the external circuit; and a second voltage lead of the second four terminal shunt is coupled to a second voltage lead of the third four terminal shunt and to the external circuit.

13. The method of providing a current source according to claim 8, wherein providing the processing circuit comprises providing a current comparator having a first input, a second input, and an output, providing a resistor disposed between the first input of the current comparator and the output of the current comparator which is also coupled to the external circuit, and providing a four terminal shunt coupled in series with a load across the primary winding; wherein the first input of the current comparator is coupled to a first predetermined end of the first secondary winding and a first predetermined end of the second secondary winding corresponding to the first end of the first secondary winding;

the second input of the current comparator is coupled to the other end of the second secondary winding and to the other end of the first secondary winding via the alternating current source;

a first current lead of the third four terminal shunt is coupled to the primary winding at the end corresponding to the first end of the first secondary winding and a second current lead of the four terminal shunt is coupled to the other end of the primary winding via the load;

a first voltage lead of the four terminal shunt at the same end as the first current lead of the four terminal shunt is coupled to the external circuit; and a second voltage lead of the four terminal shunt is coupled to a second voltage lead of the four terminal shunt and to the external circuit.

14. The method of providing a current source according to claim 8, wherein a third four terminal shunt coupled in series with a load across the primary winding; and the processing circuit comprises a first four terminal shunt and a second four terminal shunt; wherein a first current lead of the first four terminal shunt is coupled to a first predetermined end of the first secondary winding and a second current lead of the first four terminal shunt is coupled to the other end of the first secondary winding via the alternating current source;

a first current lead of the second four terminal shunt is coupled to a first end of the second secondary winding corresponding to the first end of the first secondary winding and a second current lead of the second four terminal shunt is coupled to the other end of the second secondary winding;

a first current lead of the third four terminal shunt is coupled to the primary winding at the end corresponding to the first end of the first secondary winding and a second current lead of the third four terminal shunt is coupled to the other end of the primary winding via the load;

a first voltage lead of the first four terminal shunt at the same end as the first current lead of the first four terminal shunt is coupled to the external circuit;

a first voltage lead of the second four terminal shunt at the same end as the first current lead of the first four terminal shunt is coupled to the external circuit;

a first voltage lead of the second four terminal shunt at the same end as the second current lead of the second four terminal shunt is coupled to the external circuit;

the second voltage leads of the first and second four terminal shunts are coupled together;

a first voltage lead of the third four terminal shunt at the same end as the first current lead of the third four terminal shunt is coupled to the external circuit; and a second voltage lead of the second four terminal shunt is coupled to a second voltage lead of the third four terminal shunt and to the external circuit.

\* \* \* \* \*